United States Patent
Cheah

(10) Patent No.: US 6,896,976 B2
(45) Date of Patent: May 24, 2005

(54) TIN ANTIMONY SOLDER FOR MOSFET WITH TINIAG BACK METAL

(75) Inventor: Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 111 days.

(21) Appl. No.: 10/410,719

(22) Filed: Apr. 9, 2003

(65) Prior Publication Data

US 2004/0200886 A1 Oct. 14, 2004

(51) Int. Cl.$^7$ .......... B32B 15/04; B23K 28/00; H01L 23/00
(52) U.S. Cl. .......... 428/647; 428/621; 428/646; 428/648; 428/660; 428/661; 428/929; 257/763; 257/768; 228/123.1; 438/582; 438/648
(58) Field of Search .......... 428/621, 646, 428/647, 648, 660, 661, 929; 228/123.1; 257/763, 768; 438/582, 648

(56) References Cited

U.S. PATENT DOCUMENTS 4,480,261 A * 10/1984 Hattori et al. .......... 257/753
6,376,910 B1 * 4/2002 Munoz et al. .......... 257/741
6,704,189 B2 * 3/2004 Yoshii et al. .......... 361/308.1

FOREIGN PATENT DOCUMENTS

JP 54152867 A * 12/1979 .......... H01L/23/48
JP 10223835 A * 8/1998 .......... H01L/27/00

* cited by examiner

Primary Examiner—Stephen Stein
(74) Attorney, Agent, or Firm—Ostrolenk, Faber, Gerb & Soffen, LLP

(57) ABSTRACT

A semiconductor device is disclosed containing a semiconductor die having a trimetal electrode soldered to a substrate by a Sn—Sb solder.

10 Claims, No Drawings

TIN ANTIMONY SOLDER FOR MOSFET WITH TINIAG BACK METAL

BACKGROUND OF THE INVENTION

1. Field of the Invention

The present invention relates to solder alloys used for metal joining in electronic devices, more specifically to tin-antimony solder to solder down trimetal electrodes in electronic devices.

2. Description of the Related Art

Semiconductor devices such as diodes, thyristors, MOS-gated devices such as MOSFETs, IGBTs and the like are commonly formed in silicon semiconductor dice containing the device junctions. The dice have metallized bottom drain or other power electrodes and have source and gate electrodes or other power electrodes on their upper surfaces. The dice are mounted on enlarged conductive lead frame pads or conductive segments of a printed circuit board or IMS; or DBC or the like by soldering and the power electrodes on the upper die surface have connection wires which are wire bonded by plural wires from the conductive electrode area of the dice to flat connection post areas which are in turn connected to the exterior lead conductors of the lead frame or other support.

In general, soldering is performed for the purpose of mechanical or electrical joining. The solder alloys are normally required to be superior in joining properties and corrosion resistance. In addition, the solder alloys desirably have a high thermal fatigue strength and a desired soldering temperature, and do not contain lead from the environmental point of view.

That is, lead in any form shows an internal accumulative toxicity. Therefore, problems of air pollution and waste treatment in the lead smelting process, accumulation in the physical bodies of babies and pregnant women due to exposure to the air and contamination of foods and the like are concerned.

It is also important that the solder alloys have a high thermal fatigue strength. This is because, since semiconductor device chips generate heat when powered, the solder joining a chip to a metal support is subject to a large thermal strain. The thermal strain is also generated in the soldering of the chips. Thus, the solder alloys forming the soldering part are subjected to a rigorous operation environment.

Furthermore, the solder alloys are desirably those which are high in melting point and are not adversely affected by temperature excursions of subsequent processes.

Conventional solder alloys include tin-lead (Sn—Pb) alloy, tin-silver (Sn—Ag) alloy and tin-antimony (Sn—Sb) alloy.

Since the tin-lead (Sn—Pb) alloy is low in tensile strength and superior in ductility, it is high in strain generation and low in fatigue strength. Therefore, in conjunction with its low heat resistance, it is low in thermal fatigue strength. The Sn—Pb alloy has an eutectic temperature of 183° C. The melting point can be increased from 183° C. to the vicinity of 300° C. by increasing the Pb content. However, since this widens the solid-liquid coexistence area between liquid phase temperature and solid phase temperature (183° C.) and the eutectic temperature is 183° C., it has problems in that it is low in heat resistance and tends to undergo material degradation at relatively low temperatures. The external solder is Sn—Pb. The internal solder alloy of the package is Sn—Ag, e.g. Sn 96.5%-Ag 3.5%. The liquid phase solid phase temperature is 221° C. In addition, when Sn—Ag alloys are used to solder trimetal surfaces such as Ti—Ni—Ag, the titanium layer gets attacked (i.e. oxidized) when the nickel and silver layers are dissolved.

The Sn—Sb alloy is relatively higher in strength and is thus better than the Sn—Ag alloy. The Sn—Sb alloy contains 8.5% by weight of Sb, has a peritectic point at 245° C., and Sb is used normally in an amount of less than 8% by weight. Since melting takes place between melting temperature 232° C. of Sb and the peritectic temperature 245° C., the solid-liquid coexistence area is small, the heat resistance is good, and one which is high in strength can be obtained by increasing the Sb content. However, the Sn—Sb alloy has problems in that it becomes degraded in processability particularly when the Sb content is increased, and becomes low in wettability at soldering. Furthermore, the prior art teaches (see U.S. Pat. No. 6,179,935) that Sn—Sb alloys show considerable formation of oxide film which is a particular problem in soldering trimetal surfaces. Accordingly, no Sn—Sb alloy was ever used to solder down trimetal surfaces. Instead, a more conventional Sn—Pb was used for these surfaces despite the presence of the above-identified disadvantages including also the formation of oxide films.

SUMMARY OF THE INVENTION

The present invention relates to a semiconductor device comprising a semiconductor die having a trimetal electrode soldered to a substrate by a Sn—Sb solder.

The present invention also relates to a method of manufacturing a semiconductor device containing a semiconductor die with a trimetal electrode, said method comprising soldering said trimetal electrode to a substrate by a Sn—Sb solder.

DETAILED DESCRIPTION OF THE INVENTION

It has been surprisingly found that the use of Sn—Sb solder to solder trimetal surfaces in semiconductor devices reduces the formation of oxide metals and thus reduces corrosion. For instance, it was surprising to note that when Sn—Sb alloys are used to solder trimetal surfaces such as Ti—Ni—Ag, the titanium layer stays relatively protected from oxidation even when the nickel and silver layers are dissolved.

Preferably, the trimetal electrode is Ti—Ni—X, where X is a highly conductive element. More preferably, X is Ag. Also preferably, the substrate is lead frame pad, the semiconductor is MOSFET and Sn—Sb solder comprises about 95% by weight Sn and about 5% Sb.

EXAMPLE 1

Preparation of Sn—Sb and Sn—Ag Solder Alloys

Sn—Sb and Sn—Ag alloys were prepared by melting raw materials (Sn—Sb and Sn—Ag) in an electric furnace. The composition of the Sn—Sb alloy is about 95% Sn and about 5% Sb by weight while the composition of the Sn—Ag alloy is 96.5% Sn and 3.5% Ag by weight. The raw materials used in the present example had purities of 99.99% or better.

EXAMPLE 2

Soldering Trimetal Surfaces to Lead Frame Substrates Using Sn—Sb and Sn—Ag Solder Alloys Example dice (Q1,Q2) were attached to a substrate by a solder according to the invention (Sn/Sb) and prior art solder (Sn/Ag) and they heated for a period of time in an Autoclave oven at 100% humidity. Then corrosion in each case was observed.

Q1 had a trimetal contact of Ti (0.1) Ni (0.2) Ag (0.35). solder according to the invention was made by Kester (Sn 96.5%, Sb 3.5%). The solder according to prior art was made by OMG (Sn 96.5%, Ag 3.5%).

The test pieces were produced by disposing an amount of solder between an example die (Q1,Q2) and a substrate such as a circuit board and then heating the combination to reflow the solder. In all cases the solder was heated to 245° C. The test pieces (substrate, solder and die combinations) were then placed in an Acutoclave (AC) and heated to about 120° C. for 87 hours at 100% humidity. When a solder according to the invention was used no corrosion was observed. When a solder according to prior art was used slight to moderate and significant corrsion was detected. The results are shown in Table 1. Q2 had a trimetal contact of Ti (0.1) Ni (0.4) Ag (0.6). The

TABLE 1

| | | | | Ti | Ni | Ag | |
|---|---|---|---|---|---|---|---|
| Sn/Ag/x Sn/Sb Solder DOE | 245° C. Reflow | Kester Sn 96.5%/Sb 3.5% | Q1 Gen 10 | 0.1 | 0.2 | 0.25 | Looks very good, no corrosion 2/2 parts (87 hrs AC) |
| | | | Q2 M1 | 0.1 | 0.4 | 0.6 | Looks very good, no corrosion 2/2 parts (87 hrs AC) |
| | 245° C. Reflow | OMG Sn 96.5%/Ag 3.5% | Q1 Gen 10 | 0.1 | 0.2 | 0.25 | Slight to moderate peripheral corrosion 2/2 parts (87 hrs AC) |
| | | | Q2 M1 | 0.1 | 0.4 | 0.6 | Significant (80%) peripheral corrosion 2/2 parts (87 hrs AC) |

Q1 (with inventive solder) - No corrosion detected.
Q2 (with inventive solder) - No corrosion detected.
Q1 (with prior art solder) - Slight to moderate corrosion specially in the periphery of the die.
Q2 (with prior art solder) significant (80%) peripheral corrosion.

What is claimed is:

1. A semiconductor device comprising a semiconductor die having a trimetal electrode soldered to a substrate by a solder consisting essentially of tin and antimony, wherein the trimetal electrode is Ti—Ni—X, where X is a highly conductive element.

2. The semiconductor device of claim 1, wherein X is Ag.

3. The semiconductor device of claim 1, wherein the Sn—Sb solder comprises about 95% Sn and about 5% Sb by weight.

4. The semiconductor device of claim 1, wherein the substrate is a lead frame pad.

5. The semiconductor device of claim 1, wherein the device is a MOSFET.

6. A method of manufacturing a semiconductor device containing a semiconductor die with a trimetal electrode, said method comprising soldering said trimetal electrode to a substrate by a solder consisting essentially of tin and antimony., wherein the trimetal electrode is Ti—Ni—X, where X is a highly conductive element.

7. The method of claim 6, wherein X is Ag.

8. The method of claim 6, wherein the Sn—Sb solder comprises about 95% Sn and about 5% Sb by weight.

9. The method of claim 6, wherein the substrate is a lead frame pad.

10. The method of claim 6, wherein the semiconductor device is a MOSFET.

* * * * *

UNITED STATES PATENT AND TRADEMARK OFFICE
CERTIFICATE OF CORRECTION

PATENT NO. : 6,896,976 B2
DATED : May 24, 2005
INVENTOR(S) : Chuan Cheah

It is certified that error appears in the above-identified patent and that said Letters Patent is hereby corrected as shown below:

Title page,
Item [54], Title, should read:
-- TIN ANTIMONY SOLDER FOR MOSFET WITH TiNiAg BACK METAL --

Signed and Sealed this

Twelfth Day of July, 2005

JON W. DUDAS
*Director of the United States Patent and Trademark Office*